(12) United States Patent
Komaki

(10) Patent No.: US 7,493,582 B2
(45) Date of Patent: Feb. 17, 2009

(54) PATTERN LAYOUT AND LAYOUT DATA GENERATION METHOD

(75) Inventor: Masaki Komaki, Kasugai (JP)

(73) Assignee: Fujitsu Limited, Nakahara-Ku Kawasaki-Shi Kanagawa (JP)

( * ) Notice: Subject to any disclaimer, the term of this patent is extended or adjusted under 35 U.S.C. 154(b) by 34 days.

(21) Appl. No.: 11/589,145

(22) Filed: Oct. 30, 2006

(65) Prior Publication Data

US 2007/0096158 A1 May 3, 2007

(30) Foreign Application Priority Data

Oct. 31, 2005 (JP) .............................. 2005-316456

(51) Int. Cl.
*G06F 17/50* (2006.01)
*H01L 27/00* (2006.01)

(52) U.S. Cl. .............................. 716/9; 716/10; 257/499

(58) Field of Classification Search ............... 716/8, 716/9, 10; 257/499
See application file for complete search history.

(56) References Cited

U.S. PATENT DOCUMENTS

| | | | | |
|---|---|---|---|---|
| 5,847,421 A | * | 12/1998 | Yamaguchi | ............... 257/207 |
| 5,850,093 A | * | 12/1998 | Tarng et al. | ............... 257/327 |
| 6,194,252 B1 | * | 2/2001 | Yamaguchi | ............... 438/129 |
| 6,235,575 B1 | * | 5/2001 | Kasai et al. | ............... 438/242 |
| 2001/0009291 A1 | * | 7/2001 | Miles | ............... 257/382 |
| 2002/0079551 A1 | * | 6/2002 | Hokazono | ............... 257/486 |
| 2004/0235229 A1 | * | 11/2004 | Hokazono | ............... 438/199 |
| 2006/0006437 A1 | * | 1/2006 | Song et al. | ............... 257/290 |
| 2007/0257331 A1 | * | 11/2007 | Kurjanowicz et al. | ....... 257/530 |

FOREIGN PATENT DOCUMENTS

| | | | |
|---|---|---|---|
| JP | 60-202343 | | 10/1985 |
| JP | 62052974 A | * | 3/1987 |
| JP | 64-053575 | | 3/1989 |
| JP | 02309665 A | * | 12/1990 |
| JP | 07142726 A | * | 6/1995 |
| JP | 08078684 A | * | 3/1996 |
| JP | 10200097 A | * | 7/1998 |
| JP | 2000040758 A | * | 2/2000 |
| JP | 2002305302 A | * | 10/2002 |
| JP | 2004342730 A | * | 12/2004 |

* cited by examiner

*Primary Examiner*—Phallaka Kik
(74) *Attorney, Agent, or Firm*—Fujitsu Patent Center

(57) ABSTRACT

A transistor layout including a diffusion region and a gate line. The gate line intersects part of the diffusion region in an overlapping manner. The layout includes an L-shaped bent portion included in the diffusion region. An auxiliary pattern is included in the diffusion region opposite to the L-shaped bent portion so that the gate line is located between the L-shaped bent portion and the auxiliary pattern. The auxiliary pattern and the L-shaped bent portion are spaced from the gate line by the same distance.

20 Claims, 7 Drawing Sheets

PATTERN LAYOUT AND LAYOUT DATA GENERATION METHOD

CROSS-REFERENCE TO RELATED APPLICATIONS

This application is based upon and claims the benefit of priority from prior Japanese Patent Application No. 2005-316456, filed on Oct. 31, 2005, the entire contents of which are incorporated herein by reference.

BACKGROUND OF THE INVENTION

The present invention relates to a layout for an electric circuit of a semiconductor device that is formed on a substrate, such as a semiconductor chip, and a method for generating layout data for such an electric circuit. More particularly, the present invention relates to a pattern layout for a transistor and a method for generating layout data for a transistor.

FIG. 1 shows a layout for a metal oxide semiconductor (MOS) transistor. The MOS transistor is formed on a wafer in accordance with the layout. A diffusion region 1 has a bent portion bent at a right angle. The diffusion region 1 extends toward a well tap region (substrate contact region), a source-drain region of another transistor, or a connection node with a signal line or a power supply line etc.

A gate line 2, which is included in a polysilicon layer, overlaps part of the diffusion region 1. The gate line 2 extends perpendicularly to the diffusion region 1. Separate masks are used during exposure of the diffusion region 1 and the gate line 2. An exposure process and an etching process are performed on the diffusion region 1. Then, an exposure process and an etching process are performed on the gate line 2.

FIGS. 2A to 2C each show a diffusion region 3 and a gate line 4 that are formed on a wafer based on the layout shown in FIG. 1. The diffusion region 3 has an inner corner 5 that is rounded due to the exposure and etching.

FIG. 2A shows a gate line 4 that is formed at a desirable position. Since part of the gate line 4 overlaps a rounded inner corner 5 of the diffusion region 3, the gate line 4 has a gate width $W+\Delta W$, which is greater than the desired gate width W shown in the state of FIG. 1.

As shown in FIG. 2B, a mask alignment error, or tolerance, may cause the gate line 4 to be formed at a position closer to the rounded inner corner 5. In this case, the increase in the overlapped part of the gate line 4 with the rounded inner corner 5 results in the gate line 4 having an increased gate width $W+\Delta W+\alpha$, which is greater than the gate width $W+\Delta W$ shown in the state of FIG. 2A.

As shown in FIG. 2C, a mask alignment error may cause the gate line 4 to be formed at a position farther from the rounded inner corner 5. In this case, the decrease in the overlapped part of the gate line 4 with the rounded inner corner 5 results in the gate line 4 having a decreased gate width $W+\Delta-\alpha$, which is less than the gate width $W+\Delta W$ shown in the state of FIG. 2A.

In this way, when the diffusion region 3 has the rounded inner corner 5, a mask alignment error would vary the gate width and change the transistor characteristics.

FIG. 3 shows the layout of another MOS transistor. A MOS transistor is formed on a wafer in accordance with the layout. A gate line 7 is overlapped with part of a straight portion of a diffusion region 6. The gate line 7 has a bent portion bent at a right angle. The gate line 7 extends toward a gate of another transistor or a connection node with another line.

FIGS. 4A to 4C each show a diffusion region 8 and a gate line 9 that are formed on a wafer based on the layout shown in FIG. 3. The gate line 9 has an inner corner 10 that is rounded due to exposure and etching.

FIG. 4A shows a gate line 9 that is formed at a desirable position. Since part of a rounded inner corner 10 of the gate line 9 overlaps a diffusion region 8, the gate line 9 has a gate length $L+\Delta L$, which is greater than the desirable gate length L shown in the state of FIG. 3.

As shown in FIG. 4B, a mask alignment error may cause the rounded inner corner 10 of the gate line 9 to be formed at a position closer to the diffusion region 8. In this case, the increase in the overlapped part of the rounded inner corner 10 with the diffusion region 8 results in the gate line 9 having an increased gate length $L+\Delta L+\alpha$, which is greater than the gate length $L+\Delta L$ shown in the state of FIG. 4A.

As shown in FIG. 4C, a mask alignment error may cause the rounded inner corner 10 of the gate line 9 to be formed at a position farther from the diffusion region 8. In this case, the decrease in the overlapped part of the rounded inner corner 10 with the diffusion region 8 causes the gate line 9 having a decreased gate length $L+\Delta L-\alpha$, which is less than the gate length $L+\Delta L$ shown in the state of FIG. 4A.

In this way, when the gate line 9 has the rounded inner corner 10, a mask alignment error changes the gate width, and changes the transistor characteristics.

SUMMARY OF THE INVENTION

Japanese Laid-Open Patent Publication No. 60-202343 describes a technique for arranging the gate electrodes of adjacent transistors at positions symmetric to each other. This offsets changes in the transistor characteristics caused by manufacturing errors. However, this publication does not teach the prevention of changes in the transistor characteristics that may be caused by the presence of a rounded inner corner in a diffusion region or in a gate line.

Japanese Laid-Open Patent Publication No. 64-53575 describes a technique for arranging a source region or a drain region and each gate electrode on a straight line connecting a source and a drain. This prevents changes in transistor characteristics that may be caused by mask alignment errors. However, this publication does not teach the prevention of changes in the transistor characteristics that may be caused by the presence of a rounded inner corner in a diffusion region or in a gate line.

The present invention prevents changes in transistor characteristics that may be caused by the presence of a rounded inner corner in a diffusion region or in a gate line when a mask alignment error occurs.

One aspect of the present invention is a layout for an electric circuit of a semiconductor device including a diffusion region and a gate line in which the gate line intersects part of the diffusion region. An L-shaped bent portion is included in the diffusion region. An auxiliary pattern is included in the diffusion region opposite to the L-shaped bent portion. The gate line is located between the L-shaped bent portion and the auxiliary pattern and is spaced from the-auxiliary pattern by a predetermined distance. The L-shaped bent portion is spaced from the gate line by the same predetermined distance.

A further aspect of the present invention is a layout including a diffusion region and a gate line in which the gate line intersects part of the diffusion region. An L-shaped bent portion is included in the gate line. An auxiliary pattern is included in the gate line opposite to the L-shaped bent portion. The diffusion region is located between the L-shaped bent portion and the auxiliary pattern and is spaced from the auxiliary pattern by a predetermined distance. The L-shaped bent portion is spaced from the diffusion region by the same predetermined distance.

Another aspect of the present invention is a method for generating layout data including a pattern of a diffusion region and a pattern of a gate line in which the pattern of the gate line intersects part of the pattern of the diffusion region. The method includes searching for an L-shaped bent portion included in the pattern of the diffusion region and spaced from the pattern of the gate line. Adding an auxiliary pattern to the diffusion region opposite to the L-shaped bent portion so that the pattern of the gate line is located between the L-shaped bent portion and the auxiliary pattern in which the auxiliary pattern is spaced from the pattern of the gate line by a predetermined distance. The L-shaped bent portion is spaced from the pattern of the gate line by the same predetermined distance.

A further aspect of the present invention is a method for generating layout data including a pattern of a diffusion region and a pattern of a gate line in which the pattern of the gate line intersects part of the pattern of the diffusion region. The method includes searching for an L-shaped bent portion included in the pattern of the gate line and spaced from the pattern of the diffusion region, and adding an auxiliary pattern to the gate line opposite to the L-shaped bent portion so that the pattern of the diffusion region is arranged between the L-shaped bent portion and the auxiliary pattern in which the auxiliary pattern is spaced from the diffusion region by a predetermined distance, and the L-shaped bent portion is spaced from the diffusion region by the same predetermined distance.

Another aspect of the present invention is a semiconductor device including a diffusion region formed by performing exposure and etching with a mask. A gate line is formed by performing exposure and etching with a mask. The gate line and the diffusion region each include a straight portion with the straight portion of the gate line intersecting the straight portion of the diffusion region in an overlapping manner. The diffusion region includes a first L-shaped bent portion spaced from the straight portion of the gate line. A second L-shaped bent portion is arranged opposite to the first L-shaped bent portion so that the gate line is located between the first and second L-shaped bent portions in which the first and second L-shaped bent portions each include a rounded inner corner. The straight portion of the gate line partially overlaps at least one of the rounded inner corners.

A further aspect of the present invention is a semiconductor device including a diffusion region formed by performing exposure and etching with a mask. A gate line is formed by performing exposure and etching with a mask. The gate line and the diffusion region each include a straight portion with the straight portion of the gate line intersecting the straight portion of the diffusion region in an overlapping manner. The gate line includes a first L-shaped bent portion spaced from the straight portion of the diffusion region. A second L-shaped bent portion is arranged opposite to the first L-shaped bent portion so that the diffusion region is located between the first and second L-shaped bent portions in which the first and second L-shaped bent portions each include a rounded inner corner. The straight portion of the diffusion region partially overlaps at least one of the rounded inner corners.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 5:
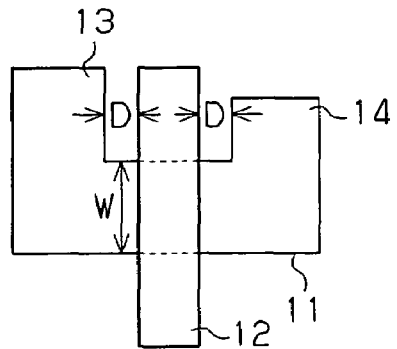
FIG. 5 is a diagram showing the layout of a gate line that extends perpendicularly to a diffusion region according to a first embodiment of the present invention.

A method for generating layout data according to a first embodiment of the present invention will now be described. FIG. 5 shows the layout of a MOS transistor that is generated using the layout data generation method of the first embodiment. The layout shown in FIG. 5 is based on the conventional layout shown in FIG. 1. A semiconductor device that is fabricated based on the layout shown in. FIG. 5 has uniform transistor characteristics irrespective of the accuracy in mask alignment.

Figure 13:
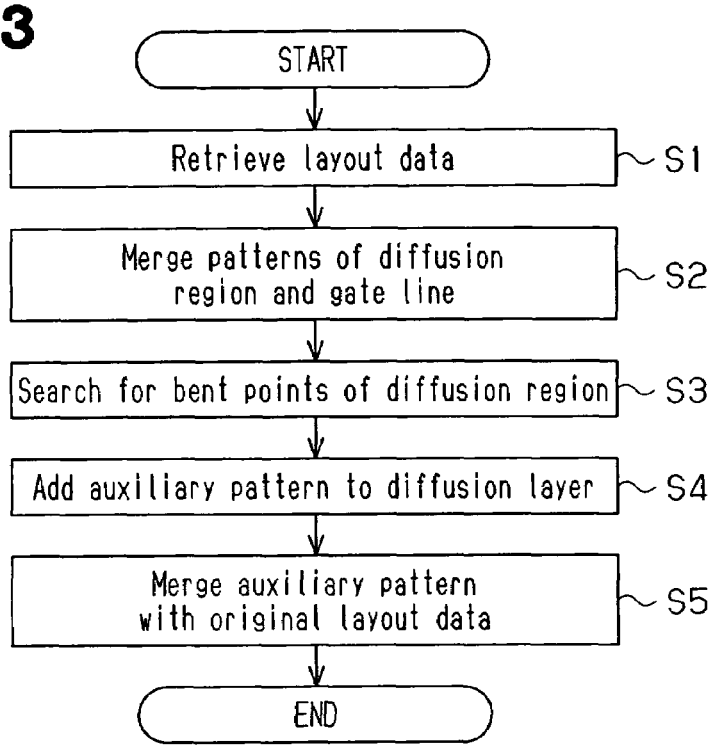
FIGS. 13 and 14 are flowcharts showing a layout data generation process.

The layout data generation method will now be described with reference to FIG. 13.

Figure 1:
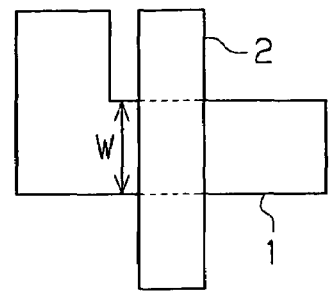
FIG. 1 is a diagram showing the layout of a gate line that extends perpendicularly to a diffusion region in a first prior art example.
Figure 2A:
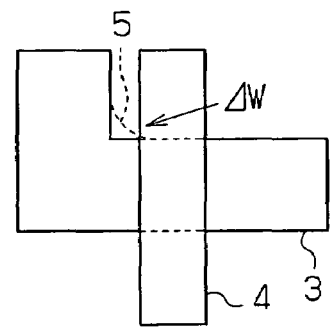
FIGS. 2A to 2C are explanatory diagrams showing changes in the distance between a gate line and an inner corner of a diffusion region.
Figure 2B:
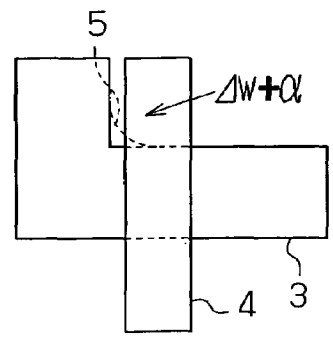
Figure 2C:
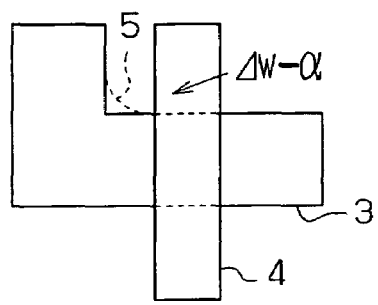

A layout data generation apparatus retrieves layout data for a diffusion region 1 and a gate line 2 from the original layout data shown in FIG. 1 (step S1).

The layout data generation apparatus performs a logical OR operation on the patterns of the diffusion region 1 and the gate line 2 and merges the patterns of the diffusion region 1 and the gate line 2 (step S2). The layout data generation apparatus checks the shape of the diffusion region 1 and searches for bent points (bent portions) of the diffusion region 1 that are located in the vicinity of the gate line 2 (step S3). The area of the search is, for example, determined so as to cover a range including locations where a rounded inner corner would actually be formed in the bent portion of the diffusion region 1.

The layout data generation apparatus adds an auxiliary pattern 14 to the diffusion region 1 (step S4) and merges the auxiliary pattern 14 with the original layout data (step S5). The auxiliary pattern 14 will be described later.

FIG. 5 shows a layout that is generated using the layout data generation method. The layout includes a diffusion region 11 and a gate line 12. The gate line 12, which is included in a polysilicon layer, is laid on an upper layer of the diffusion region 11 to extend perpendicularly to the diffusion region 11.

The diffusion region 11 includes an L-shaped bent portion 13 at one side of the gate line 12. The L-shaped bent portion 13 may bend at a right angle. The L-shaped bent portion 13 extends toward a well tap region (substrate contact region), a source-drain region of another transistor, or a connection node with a signal line or a power supply line etc.

The diffusion region 11 further includes the auxiliary pattern 14, which is bent and laid out at the other side of the gate line 12. The auxiliary pattern 14 extends in the same direction as the direction in which the L-shaped bent portion 13 extends. The gate line 12 is laid out in a manner that the two sides of the gate line 12 are respectively spaced from the L-shaped bent portion 13 and the auxiliary pattern 14 by the same distance D.

The patterns of the diffusion region 11 and the gate line 12 are exposed using separate masks. An exposure process and an etching process for forming the diffusion region 11 are performed first. Then, an exposure process and an etching process for forming the gate line 12 are performed.

Figure 6A:
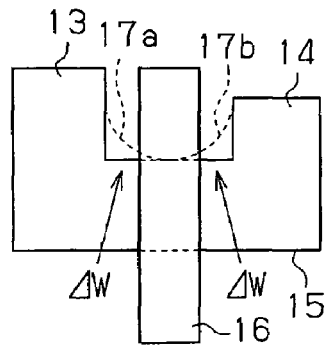
FIGS. 6A to 6C are explanatory diagrams showing changes in the distance between a gate line and an inner corner of a diffusion region based on the layout shown in FIG. 5.

FIG. 6A shows a diffusion region 15 and a gate line 16 that are formed on a wafer based on the layout shown in FIG. 5. The diffusion region 15 includes an L-shaped bent portion 13 and an L-shaped bent portion corresponding to the auxiliary pattern 14. The L-shaped bent portion 13 forms a rounded inner corner 17a, and the L-shaped bent portion corresponding to the auxiliary pattern 14 forms a rounded inner corner 17b. Parts of the gate line 16 overlapped with the rounded inner corners 17a and 17b have a gate width W+ΔW, which is greater than the desirable gate width W shown in FIG. 5.

Figure 6B:
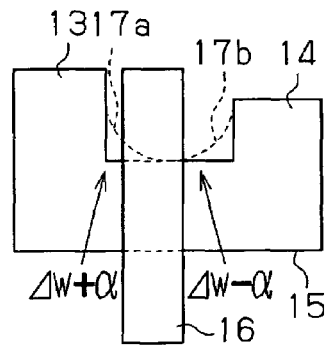

FIG. 6B shows a case in which a mask alignment error causes the gate line 16 to be formed on the diffusion region 15 at a position closer to the rounded inner corner 17a. In this case, the part of the gate line 16 overlapping the rounded inner corner 17a has a gate width W+Δ+αwhich is greater than the gate width W+ΔW shown in FIG. 6A. Further, the part of the gate line 16 overlapping the rounded inner corner 17b has a gate width W+ΔW−α, which is less than the gate width W+ΔW shown in FIG. 6A.

In this case, the total area of the parts of the gate line 16 overlapping the rounded inner corners 17a and 17b is the same as in the case of FIG. 6A. This substantially offsets the changes in the gate width.

Figure 6C:
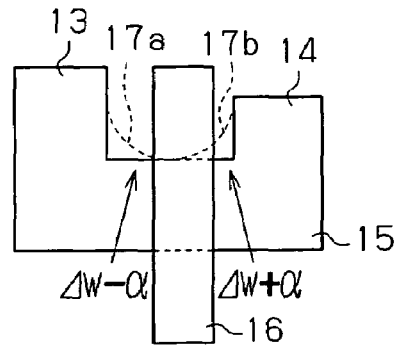

FIG. 6C shows a case in which a mask alignment error causes the gate line 16 to be formed on the diffusion region 15 at a position closer to the rounded inner corner 17b. In this case, the part of the gate line 16 overlapping the rounded inner corner 17b has a gate width W+ΔW+α, which is greater than the gate width W+ΔW shown in FIG. 6A. Further, the part of the gate line 16 overlapping the rounded inner corner 17a has a gate width W+ΔW−α, which is less than the gate width W+ΔW shown in FIG. 6A. In this case, the total area of the parts of the gate line 16 overlapping the rounded inner corners 17a and 17b is the same as in the case of FIG. 6A. This substantially offsets the changes in the gate width.

Figure 7:
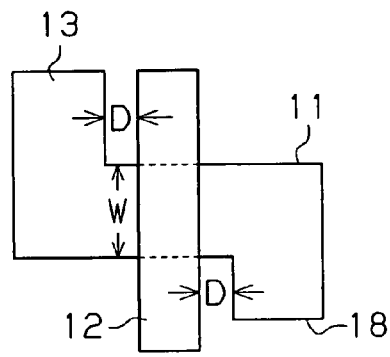
FIG. 7 is a diagram showing the layout of a gate line that extends perpendicularly to a diffusion region according to a second embodiment of the present invention.

FIG. 7 shows a layout in which an auxiliary pattern 18, which is formed through step S4, bends in a direction opposite to the direction in which the L-shaped bent portion 13 of a diffusion region 11 extends. The gate line 12 is laid out in a manner that the two sides of the gate line 12 are respectively spaced from the L-shaped bent portion 13 and the auxiliary pattern 18 by the same distance D.

Figure 8A:
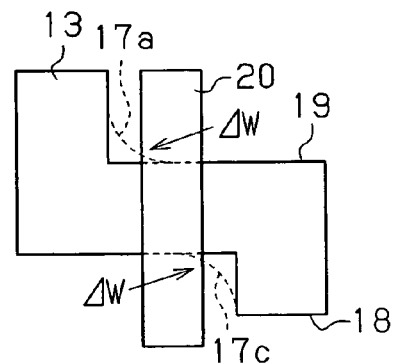
FIGS. 8A to 8C are explanatory diagrams showing changes in the distance between a gate line and an inner corner of a diffusion region based on the layout shown in FIG. 7.

FIG. 8A shows a diffusion region 19 and a gate line 20 that are formed on a wafer based on the layout shown in FIG. 7. The diffusion region 19 includes an L-shaped bent portion 13 and an L-shaped bent portion corresponding to the auxiliary pattern 18. The L-shaped bent portion 13 forms a rounded inner corner 17a, and the L-shaped bent portion corresponding to the auxiliary pattern 18 forms a rounded inner corner 17c. Parts of the gate line 20 overlapping the rounded inner corners 17a and 17c have a gate width W+ΔW, which is greater than the desirable gate width W shown in FIG. 7.

Figure 8B:
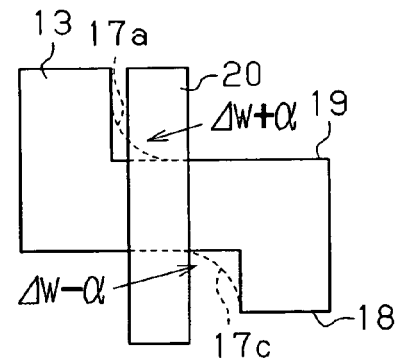

FIG. 8B shows a case in which a mask alignment error causes the gate line 20 to be formed on the diffusion region 19 at a position closer to the rounded inner corner 17a. In this case, the part of the gate line 20 overlapping the rounded inner corner 17a has a gate width W+ΔW+α, which is greater than the gate width W+ΔW shown in FIG. 8A. Further, the part of the gate line 20 overlapping the rounded inner corner 17c has a gate width W+ΔW−α, which is less than the gate width W+ΔW shown in FIG. 8A. In this case, the total area of the parts of the gate line 20 overlapping the rounded inner corners 17a and 17c is the same as in the case of FIG. 8A. This substantially offsets the changes in the gate width.

Figure 8C:
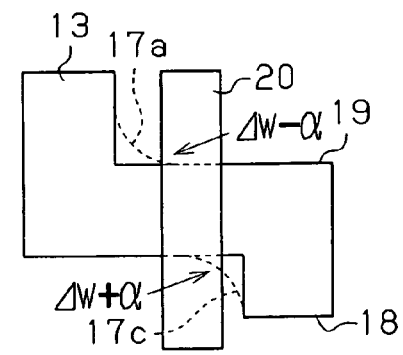

FIG. 8C shows a case in which a mask alignment error causes the gate line 20 to be formed on the diffusion region 19 at a position closer to the rounded inner corner 17c. In this case, the part of the gate line 20 overlapping the rounded inner corner 17c has a gate width W+ΔW+α, which is greater than the gate width W+ΔW shown in FIG. 8A. Further, the part of the gate line 20 overlapping the rounded inner corner 17c has a gate width W+ΔW−α, which is less than the gate width W+ΔW shown in FIG. 8A. In this case, the total area of the parts of the gate line 20 overlapping the rounded inner corners 17a and 17c is the same as in the case of FIG. 8A. This substantially offsets the changes in the gate width.

Figure 3:
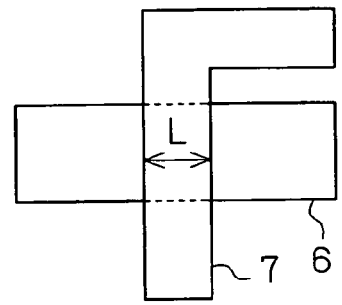
FIG. 3 shows the layout of a gate line that extends perpendicularly to a diffusion region in a second prior art example.
Figure 4A:
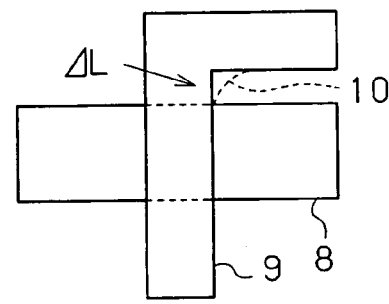
FIGS. 4A to 4C are explanatory diagrams showing changes in the distance between an inner corner of a gate line and a diffusion region.
Figure 4B:
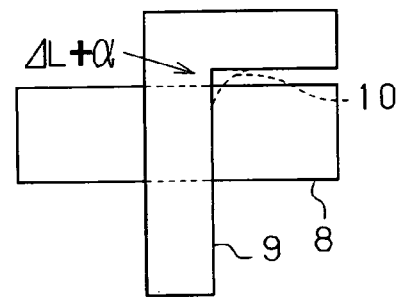
Figure 4C:
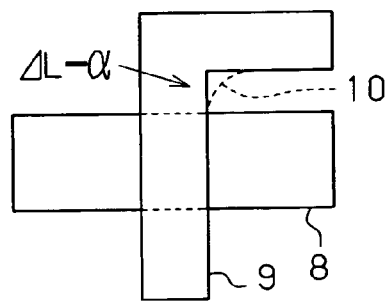
Figure 9:
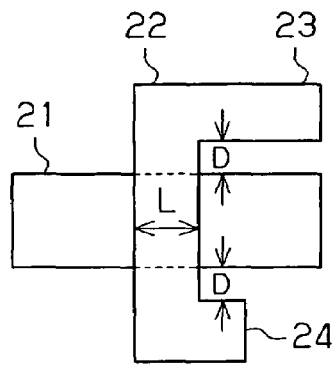
FIG. 9 is a diagram showing the layout of a gate line that extends perpendicularly to a diffusion region according to a third embodiment of the present invention.

FIG. 9 shows another example of a layout of a MOS transistor formed on a wafer. The layout is based on the conventional layout shown in FIG. 3 and is designed to stabilize transistor characteristics irrespective of the accuracy in mask alignment.

Figure 14:
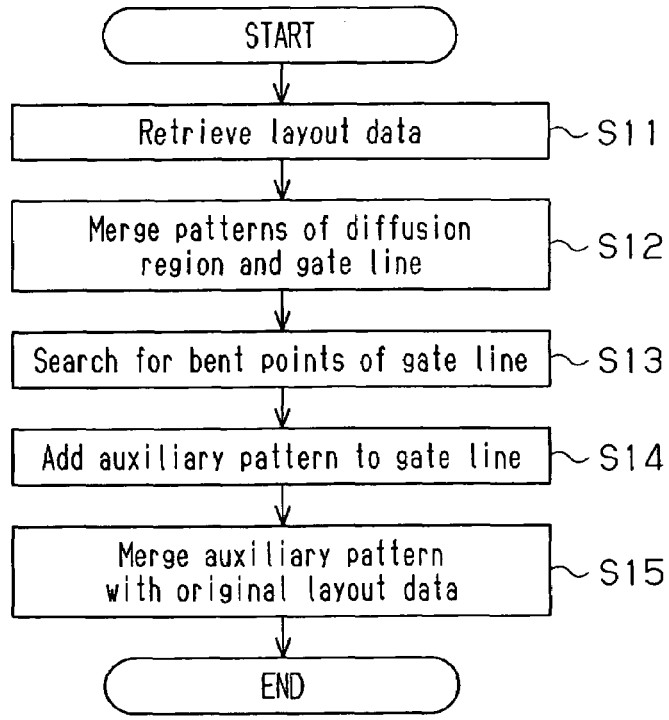

FIG. 14 shows a process for generating the layout data shown in FIG. 9. The layout data generation apparatus retrieves layout data for a diffusion region 6 and a gate line 7 from the original layout data shown in FIG. 3 (step S11).

The layout data generation apparatus performs a logical OR of the patterns of the diffusion region 6 and the gate line 7 and merges the patterns of the diffusion region 6 and the gate line 7 (step S12). The layout data generation apparatus checks the shape of the gate line 7 and searches for bent points of the gate line 7 located in the vicinity of the diffusion region 6 (step S13).

The layout data generation apparatus adds an auxiliary pattern 24 to the layout data of the gate line 7 (step S14), and merges the auxiliary pattern 24 with the original layout data (step S15). The auxiliary pattern 24 will be described later.

FIG. 9 shows a layout that is generated using the layout data generation method. A gate line 22 is laid out on a diffusion region 21 to extend perpendicularly to the diffusion region 21. The diffusion region 21 has a straight portion. The gate line 22 includes an L-shaped bent portion 23 at one side of the diffusion region 21. The L-shaped bent portion 23 may bend at a right angle (90 degrees). The L-shaped bent portion 23 extends toward the gate of another transistor or a connection node with another line.

The gate line 22 includes an auxiliary pattern 24 that is laid out at the other side of the diffusion region 21. The auxiliary pattern 24 bends in the same direction as the direction in which the L-shaped bent portion 23 extends. The gate line 22 is laid out in a manner that the L-shaped bent portion 23 and the auxiliary pattern 24 are respectively spaced from the two sides of the diffusion region 21 by the same distance D.

Figure 10A:
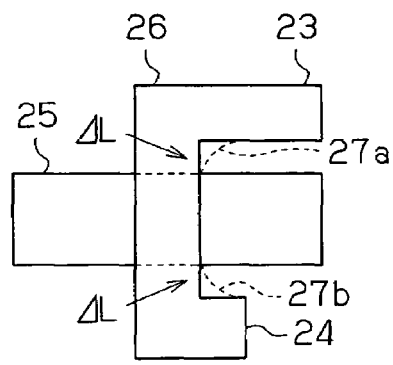
FIGS. 10A to 10C are explanatory diagrams showing changes in the distance between an inner corner of a gate line and a diffusion region based on the layout shown in FIG. 9.

FIG. 10A shows a diffusion region 25 and a gate line 26 that are formed on a wafer based on the layout shown in FIG. 9. The gate line 26 includes an L-shaped bent portion 23 and an L-shaped bent portion corresponding to an auxiliary pattern 24. The L-shaped bent portion 23 of the gate line 26 forms a rounded inner corner 27a, and the L-shaped bent portion corresponding to the auxiliary pattern 24 of the gate line 26 forms a rounded inner corner 27b. Thus, the parts of the gate line 26 overlapping the diffusion region 25 at the rounded inner corners 27a and 27b have a gate length $L+\Delta L$, which is greater than the desirable gate length L shown in FIG. 9.

Figure 10B:
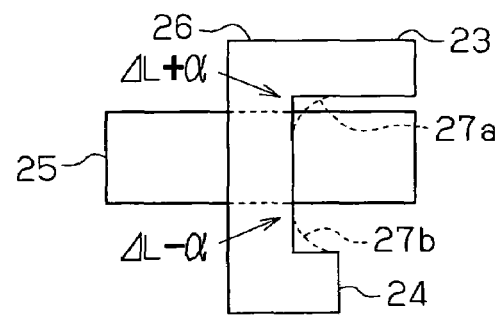

FIG. 10B shows a case in which a mask alignment error causes the diffusion region 25 to be formed at a position closer to the rounded inner corner 27a. In this case, the part of the gate line 26 overlapping the diffusion region 25 at the rounded inner corner 27a has a gate length $L+\Delta L+\alpha$, which is greater than the gate length $L+\Delta L$ shown in FIG. 10A. Further, the part of the gate line 26 overlapping the diffusion region 25 at the rounded inner corner 27b has a gate length $L+\Delta L-\alpha$, which is less than the gate length $L+\Delta L$ shown in FIG. 10A. In this case, the total area of the parts of the gate line 26 overlapping the diffusion region 25 at the rounded inner corners 27a and 27b is the same as in the case of FIG. 10A. This substantially offsets the changes in the gate length.

Figure 10C:
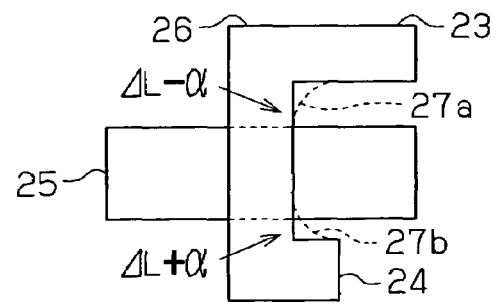

FIG. 10C shows a case in which a mask alignment error causes the diffusion region 25 to be formed at a position closer to the rounded inner corner 27b. In this case, the part of the gate line 26 overlapping the diffusion region 25 at the rounded inner corner 27b has a gate length $L+\Delta L+\alpha$, which is greater than the gate length $L+\Delta L$ shown in FIG. 10A. Further, the part of the gate line 26 overlapping the diffusion region 25 at the rounded inner corner 27a has a gate length $L+\Delta L-\alpha$, which is less than the gate length $L+\Delta L$ shown in FIG. 10A. In this case, the total area of the parts of the gate line 26 overlapping the diffusion region 25 at the rounded inner corners 27a and 27b is the same as in the case of FIG. 10A. This substantially offsets the changes in the gate length.

Figure 11:
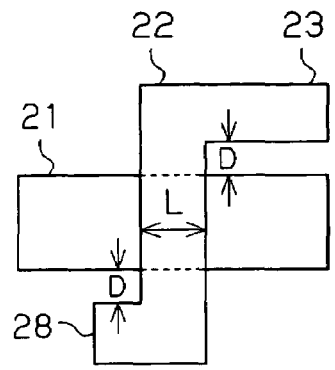
FIG. 11 is a diagram showing the layout of a gate line that extends perpendicularly to a diffusion region according to a fourth embodiment of the present invention.

FIG. 11 shows a layout in which an auxiliary pattern 28, which is formed in step S14, bends in a direction opposite to the direction in which an L-shaped bent portion 23 of a gate line 22 extends. The gate line 22 is laid out in a manner that the L-shaped bent portion 23 and the auxiliary pattern 28 are respectively spaced from the two sides of the diffusion region 21 by the same distance D.

Figure 12A:
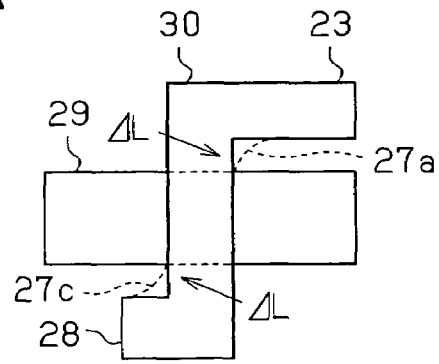
FIGS. 12A to 12C are explanatory diagrams showing changes in the distance between an inner corner of a gate line and a diffusion region based on the layout shown in FIG. 11.

FIG. 12A shows a diffusion region 29 and a gate line 30 that are formed on a wafer based on the layout shown in FIG. 11. The gate line 30 includes an L-shaped bent portion 23 and an L-shaped bent portion corresponding to the auxiliary pattern 28. The L-shaped bent portion 23 of the gate line 30 forms a rounded inner corner 27a. Further, the L-shaped bent portion corresponding to the auxiliary pattern 28 of the gate line 30 forms a rounded inner corner 27c. Parts of the gate line 30 overlapping the diffusion region 29 at the rounded inner corners 27a and 27c have a gate length $L+\Delta L$, which is greater than the desirable gate length L in the pattern data shown in FIG. 11.

Figure 12B:
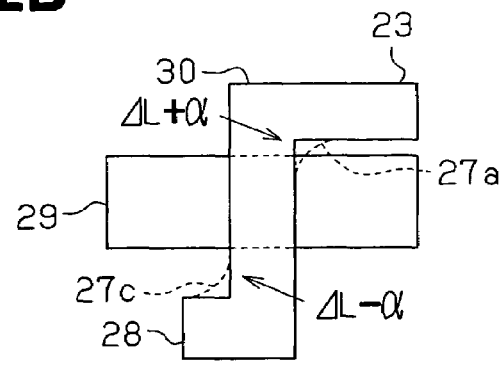

FIG. 12B shows a case in which a mask alignment error causes the diffusion region 29 to be formed at a position closer to the rounded inner corner 27a. In this case, the part of the gate line 30 overlapping the diffusion region 29 at the rounded inner corner 27a has a gate length $L+\Delta L+\alpha$, which is greater than the gate length $L+\Delta$ shown in FIG. 12A. Further, the part of the gate line 30 overlapping the diffusion region 29 at the rounded inner corner 27c has a gate length $L+\Delta L-\alpha$, which is less than the gate length $L+\Delta L$ shown in FIG. 12A. In this case, the total area of the parts of the gate line 30 overlapping the diffusion region 29 at the rounded inner corners 27a and 27c is the same as in the case of FIG. 12A. This substantially offsets the changes in the gate length.

Figure 12C:
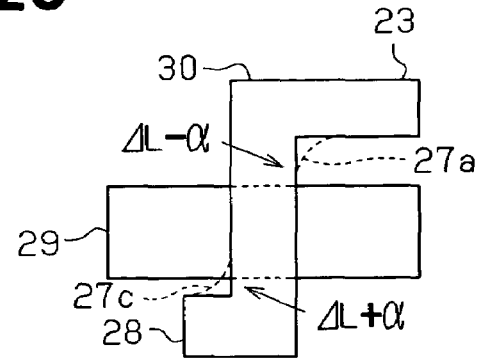

FIG. 12C shows a case in which a mask alignment error causes the diffusion region 29 to be formed at a position closer to the rounded inner corner 27c. In this case, the part of the gate line 30 overlapping the diffusion region 29 at the rounded inner corner 27c has a gate length $L+\Delta L+\alpha$, which is greater than the gate length $L+\Delta L$ shown in FIG. 12A. Further, the part of the gate line 30 overlapping the diffusion region 29 at the rounded inner corner 27a has a gate length $L+\Delta-\alpha$, which is less than the gate length $L+\Delta L$ shown in FIG. 12A.

In this case, the total area of the parts of the gate line 30 overlapping the diffusion region 29 at the rounded inner corners 27a and 27c is the same as in the case of FIG. 12A. This substantially offsets the changes in the gate length.

The generation of the layout data and the layout patterns as described above has the advantages described below.

(1) Even during the occurrence of a mask alignment error, the gate width or the gate length is prevented from changing. This prevents changes in transistor characteristics that may be caused by the presence of a rounded inner corner in a diffusion region or in a gate line when a mask alignment error occurs.

(2) The layout data generation process shown in steps S1 to S5 is performed when generating a mask pattern or a reticle pattern. This produces a mask or a reticle for preventing changes in transistor characteristics that may be caused by the presence of a rounded inner corner in a diffusion region or in a gate line when a mask alignment error occurs.

(3) Changes in transistor characteristics, which are caused by differences in the gate width or gate length in a state free of mask or reticle alignment errors, may be reflected in device recognition for generating a transistor net list or modeling for inspecting device characteristics of a transistor. This improves the accuracy of simulations performed in the design stage of a semiconductor c.

It should be apparent to those skilled in the art that the present invention may be embodied in many other specific forms without departing from the spirit or scope of the invention. Particularly, it should be understood that the present invention may be embodied in the following forms.

The search for L-shaped bent portions may be limited to a narrow range that is substantially the same as the range in which a rounded inner corner may be formed in the diffusion region or the gate line.

The present examples and embodiments are to be considered as illustrative and not restrictive, and the invention is not to be limited to the details given herein, but may be modified within the scope and equivalence of the appended claims.

What is claimed is:

1. A layout for an electric circuit, comprising:
   a diffusion region;
   a gate line intersecting part of the diffusion region;

an L-shaped bent portion included in the diffusion region; and an auxiliary pattern included in the diffusion region opposite to the L-shaped bent portion, wherein the gate line is located between the L-shaped bent portion and the auxiliary pattern and is spaced from the auxiliary pattern by a predetermined distance, and wherein the L-shaped bent portion is spaced from the gate line by the same predetermined distance.

2. The layout according to claim 1, wherein the auxiliary pattern and the L-shaped bent portion extend in a same direction.

3. The layout according to claim 1, wherein the auxiliary pattern and the L-shaped bent portion extend in opposite directions.

4. The layout according to claim 1, wherein the gate line and the diffusion region each include a straight portion, the straight portion of the gate line perpendicularly traversing the straight portion of the diffusion region, and the L-shaped bent portion extending continuously from the straight portion of the diffusion region, with the L-shaped bent portion and the auxiliary pattern being spaced by the predetermined distance from the straight portion of the gate line.

5. A layout for an electric circuit, comprising:
a diffusion region;
a gate line intersecting part of the diffusion region;
an L-shaped bent portion included in the gate line; and
an auxiliary pattern included in the gate line opposite to the L-shaped bent portion, wherein the diffusion region is located between the L-shaped bent portion and the auxiliary pattern and is spaced from the auxiliary pattern by a predetermined distance, and wherein the L-shaped bent portion is spaced from the diffusion region by the same predetermined distance.

6. The layout according to claim 5, wherein the auxiliary pattern and the L-shaped bent portion extend in a same direction.

7. The layout according to claim 5, wherein the auxiliary pattern and the L-shaped bent portion extend in opposite directions.

8. The layout according to claim 5, wherein the gate line and the diffusion region each include a straight portion, the straight portion of the gate line perpendicularly traversing the straight portion of the diffusion region, and the L-shaped bent portion extending continuously from the straight portion of the gate line, with the L-shaped bent portion and the auxiliary pattern being spaced by the predetermined distance from the straight portion of the diffusion region.

9. A method for generating layout data of an electric circuit including a pattern of a diffusion region and a pattern of a gate line in which the pattern of the gate line intersects part of the pattern of the diffusion region, the method comprising:
searching for an L-shaped bent portion included in the pattern of the diffusion region and spaced from the pattern of the gate line; and
adding an auxiliary pattern to the diffusion region opposite to the L-shaped bent portion so that the pattern of the gate line is located between the L-shaped bent portion and the auxiliary pattern in which the auxiliary pattern is spaced from the pattern of the gate line by a predetermined distance, and the L-shaped bent portion is spaced from the pattern of the gate line by the same predetermined distance.

10. The method according to claim 9, wherein the auxiliary pattern and the L-shaped bent portion extend in a same direction.

11. The method according to claim 9, wherein the auxiliary pattern and the L-shaped bent portion extend in opposite directions.

12. The method according to claim 9, wherein the pattern of the gate line and the pattern of the diffusion region each include a straight portion, the straight portion in the pattern of the gate line perpendicularly traversing the straight portion in the pattern of the diffusion region, and the L-shaped bent portion extending continuously from the straight portion of the diffusion region, with the L-shaped bent portion and the auxiliary pattern being spaced by the predetermined distance from the straight portion in the pattern of the gate line.

13. A method for generating layout data of an electric circuit including a pattern of a diffusion region and a pattern of a gate line in which the pattern of the gate line intersects part of the pattern of the diffusion region, the method comprising:
searching for an L-shaped bent portion included in the pattern of the gate line and spaced from the pattern of the diffusion region; and
adding an auxiliary pattern to the gate line opposite to the L-shaped bent portion so that the pattern of the diffusion region is arranged between the L-shaped bent portion and the auxiliary pattern in which the auxiliary pattern is spaced from the diffusion region by a predetermined distance, and the L-shaped bent portion is spaced from the diffusion region by the same predetermined distance.

14. The method according to claim 13, wherein the auxiliary pattern and the L-shaped bent portion extend in a same direction.

15. The method according to claim 13, wherein the auxiliary pattern and the L-shaped bent portion extend in opposite directions.

16. The method according to claim 13, wherein the pattern of the gate line and the pattern of the diffusion region each include a straight portion, the straight portion in the pattern of the gate line perpendicularly traversing the straight portion in the pattern of the diffusion region, and the L-shaped bent portion extending continuously from the straight portion of the gate line, with the L-shaped bent portion and the auxiliary pattern being spaced by the predetermined distance from the straight portion of the diffusion region.

17. A semiconductor device comprising:
a diffusion region formed by performing exposure and etching with a mask;
a gate line formed by performing exposure and etching with a mask, the gate line and the diffusion region each including a straight portion with the straight portion of the gate line intersecting the straight portion of the diffusion region in an overlapping manner;
the diffusion region including:
a first L-shaped bent portion spaced from the straight portion of the gate line; and
a second L-shaped bent portion arranged opposite to the first L-shaped bent portion so that the gate line is located between the first and second L-shaped bent portions in which the first and second L-shaped bent portions each include a rounded inner corner, with the straight portion of the gate line partially overlapping at least one of the rounded inner corners.

18. The semiconductor device according to claim 17, wherein the straight portion of the gate line partially overlaps with both of the rounded inner corners of the first and second L-shaped bent portions.

19. A semiconductor device comprising:
a diffusion region formed by performing exposure and etching with a mask;

a gate line formed by performing exposure and etching with a mask, the gate line and the diffusion region each including a straight portion with the straight portion of the gate line intersecting the straight portion of the diffusion region in an overlapping manner;

the gate line including:

a first L-shaped bent portion spaced from the straight portion of the diffusion region; and a second L-shaped bent portion arranged opposite to the first L-shaped bent portion so that the diffusion region is located between the first and second L-shaped bent portions in which the first and second L-shaped bent portions each include a rounded inner corner, with the straight portion of the diffusion region partially overlapping at least one of the rounded inner corners.

20. The semiconductor device according to claim 19, wherein the straight portion of the diffusion region partially overlaps with both of the rounded inner corners of the first and second L-shaped bent portions.

* * * * *